United States Patent [19]
Lauterbach et al.

[11] Patent Number: 5,107,319
[45] Date of Patent: Apr. 21, 1992

[54] MONOLITHICALLY INTEGRATED PHOTODIODE-FET COMBINATION

[75] Inventors: Christl Lauterbach, Siegertsbrunn; Helmut Albrecht, Munich, both of Fed. Rep. of Germany

[73] Assignee: Siemens Aktiengesellschaft, Munich, Fed. Rep. of Germany

[21] Appl. No.: 528,551

[22] Filed: May 25, 1990

[30] Foreign Application Priority Data

May 31, 1989 [DE] Fed. Rep. of Germany ....... 3917703

[51] Int. Cl.⁵ .......................................... H01L 27/14
[52] U.S. Cl. ....................................... 357/30; 357/22; 357/58
[58] Field of Search ................................ 357/30, 58, 22

[56] References Cited
U.S. PATENT DOCUMENTS

| | | | |
|---|---|---|---|
| 4,447,746 | 5/1984 | Fang | 357/58 |
| 4,729,000 | 3/1988 | Abrokwah | 357/22 |
| 4,894,703 | 1/1990 | Hammamsy | 357/30 |

OTHER PUBLICATIONS

Siemens Forsch.-u. Entwïcl. Bd. (1988) Nr 4 Monolithically Integrated InGaAs/InP:Fe Photodiode-Junction Field-Effect Transistor Combination.

*Primary Examiner*—Eugene R. LaRoche
*Assistant Examiner*—R. Ratliff
*Attorney, Agent, or Firm*—Hill, Van Santen, Steadman & Simpson

[57] ABSTRACT

A photodiode-FET combination having an optimized layer structure wherein the photodiode and the FET are separated from one another by a separating trench and are separated from the substrate by barrier layers forming a pn-junction in order to avoid tributary currents. A layer sequence is provided formed of an absorption layer grown on in surface-wide fashion, of a photodiode layer that is likewise grown on in surface-wide fashion and which is etched back to the region of light incidence in the region of the photodiode, of a channel layer in the region of the FET, and of a cover layer on the channel layer which forms a gate.

8 Claims, 1 Drawing Sheet

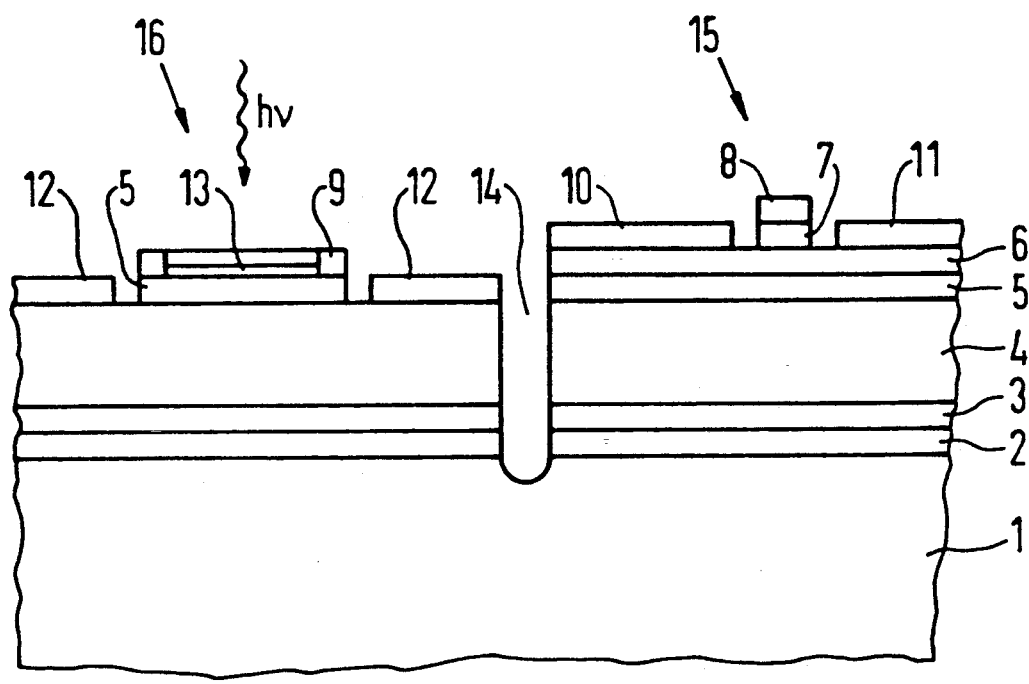

MONOLITHICALLY INTEGRATED PHOTODIODE-FET COMBINATION

BACKGROUND OF THE INVENTION

Developments in optical data transmission systems involve the use of integrated opto-electronic circuits for the connection between optical and electronic components. The problem of integration of the photodetector and pre-amplifier arises at the receiver side. Good compatibility of the semiconductor layers and manufacturing techniques required for the various components is required. A monolithically integrated, planar module that contains a photodiode and a field effect transistor (FET) on a semiconductor substrate and that takes the different requirements of doping concentration and layer thickness into consideration is recited in H. Albrecht, Ch. Lauterbach, "Monolithically Integrated InGaAs/InP:Fe Photodiode-Junction Field-Effect Transistor Combination", Siemens Forschungs-und Entwicklungsberichte 17, 195–198 (1988), incorporated herein by reference.

For a high external quantum efficiency, an optimized photodiode requires an adequately thick absorption layer of n-InGaAs having low residual doping. This nominally undoped InGaAs layer is a prerequisite for a low capacitance as well as a low dark current and, consequently, good noise properties. A highly doped n-conductive semiconductor layer (for example, InGaAs or InAlAs or InP) on the InP:Fe substrate reduces the series resistance and the transient time effects, i.e. the carrier transient time of the photodiode.

For a high transconductance, the FET requires a highly doped n+-InGaAs layer that must be correspondingly thin for a good cut-off behavior of the FET. The cover layer of n-InP or N-InAlAs forms a hetero barrier vis-a-vis the InGaAs and enables the realization of a blocking metal-to-semiconductor junction as a gate, or enables the manufacture of a barrier layer gate together with a p-diffusion or p-implantation. This layer also has the advantage that, due to the higher band spacing of InP or InAlAs compared to InGaAs, a passivation of the pn-junction at the component surface lengthens the long-term stability and reduces leakage currents. This advantage results both for the photodiode as well as for the FET.

SUMMARY OF THE INVENTION

It is an object of the present invention to specify a monolithically integrated photodiode-FET combination having a semiconductor layer structure that is optimized both for simple manufacturability and good functionability.

This object is achieved with a photodiode-FET combination wherein a grown absorption layer is provided over a substrate; a photodiode layer of second conductivity type is applied on the absorption layer at a region above the absorption layer where the field effect transistor is formed and also at a region above the absorption layer where the photodiode is formed; a second contact is also applied on the absorption layer at the location where the photodiode is formed; a first annular contact is provided on the photodiode layer at the region of the photodiode; a anti-reflection layer is provided on the photodiode layer inside the annular first contact; a channel layer of first conductivity type is applied on the photodiode layer at the region of the field effect transistor; a cover layer is applied on the channel layer; and a separating trench is provided between the photodiode and the field effect transistor.

In a further improvement of the invention a first barrier layer of second conductivity type is grown between the substrate and the absorption layer and a second barrier layer of first conductivity type is grown on the side of the first barrier layer that faces away from the substrate.

The semiconductor layer structure of the invention has the advantage that all required dopings and layer thicknesses can be manufactured in one work cycle on a planar, semi-insulating InP substrate crystal, and is manufactured in surface-wide fashion with epitaxial processes such as, for example, VPE, MOVPE, MBE or MOMBE.

The selective etching properties of the different mixed crystal layers are utilized in the following chip technology in order to selectively expose defined layers and contact them. Given optimized layer sequences for both components, thus no selective doping steps such as, for example, diffusion or ion implantation, are required after the epitaxy of the layers. Thus, high-temperature processes that could deteriorate the properties of epitaxially grown hetero layers and doping profiles are eliminated.

BRIEF DESCRIPTION OF THE DRAWING

The photodiode-FET combination of the invention is shown in cross section in the drawing figure.

DESCRIPTION OF THE PREFERRED EMBODIMENTS

In an especially advantageous development of the photodiode-FET combination of the invention, a first barrier layer 2 and a second barrier layer 3 are successively grown on a substrate 1 of, for example, semi-insulating indium phosphide. These barrier layers 2, 3 can be each respectively formed of InP, InAlAs, or InGaAlAs. The first barrier layer 2 is p-doped with an acceptor density of $N_A = 10^{15} \ldots 10^{18}$ cm$^{-3}$; and the second barrier layer 3 is n-doped and has a donor density of $N_D = 10^{16} \ldots 10^{18}$ cm$^{-3}$. The first barrier layer has a thickness of about 0.2 to 2 $\mu$m; and the second barrier layer 3 has a thickness of approximately 0.2 to 3 $\mu$m. These barrier layers 2, 3 form a blocking pn-junction that, together with a separating trench 14 that extends into the substrate 1 and is situated between the photodiode and the FET, reduces leakage currents via the semi-insulating substrate 1. In addition, the second barrier layer 3 reduces the transient time effects and series resistance in the photodiode.

An absorption layer 4 is grown surface-wide over this second barrier layer 3. For example, this absorption layer 4 is composed of InGaAs and is nominally undoped (donor density $N_D < 2*10^{15}$ cm$^{-3}$) and has a thickness of 1 to 3 $\mu$km. This absorption layer 4 is provided as the absorption layer for the photodiode. A photodiode layer 5 of p-doped InP, InAlAs, or InGaAlAs having an acceptor density of $N_A = 10^{16} \ldots 10^{18}$ cm$^{-3}$ and a thickness of 0.2 to 1 $\mu$m is grown on the absorption layer 4. This photodiode layer 5 is likewise grown in surface-wide fashion and forms first the p-region of the photodiode and, second, also electrically separates the entire photodiode layers from the following FET layers as a result of its blocking property. The cut-off behavior of the FET, moreover, is additionally beneficially influenced by this underlying photodiode layer 5 as a buffer layer (K. Steiner, U. Seiler, K. Heime, "Influence of p-InP buffer layers on submicron InGaAs/InP junction field-effect transistors", Appl. Phys. Lett. 53, 2513–2515 (1988) incorporated herein by reference). This photodiode layer 5 is etched back to such an extent in the region of the photodiode 16 that the surface of the absorption layer 4 is exposed to the extent required for the application of a contact on the absorption layer 4.

A channel layer 6 of, for example, InGaAs is grown onto the photodiode layer 5 in the region of the FET 15. This channel layer 6 of the FET is n-conductively doped with a donor density of $N_D = 10^{16} \ldots 10^{18}$ cm$^{-3}$ and has a thickness of 0.05 to 2 $\mu$m. The transconductance and the cut-off behavior of the FET are defined by the thickness and by the doping of this channel layer 6.

A cover layer 7 of InP or InAlAs or InGaAlAs is grown on as the gate of the FET. This cover layer is p-conductively doped with an acceptor density of $N_A = 10^{16} \ldots 10^{18}$ cm$^{-3}$ given a thickness of 0.2 to 1 $\mu$m. This cover layer 7 forms a hetero gate for the JFET. Alternatively, this layer can be n-conductively doped with a donor density of $N_D = 10^{14} \ldots 10^{16}$ cm$^{-3}$ given a thickness of approximately 0.5 $\mu$m. And given selection of a suitable contact material for a gate contact applied onto this cover layer 7, a MISFET can thus be realized. The channel layer 6 and the cover layer 7 are grown on only in the region of the FET 15 or are removed in the region of the photodiode 16 by selective etching. The realization of the gate region of the FET 15 and of the p-region of the photodiode 16, i.e. the parts of the photodiode layer 5 remaining in the region of the photodiode 16, can occur on the basis of a self-aligned technology, for example the T-gate technique (D. Wake, A. W. Livingstone, D. A. Andrews, G. J. Davies, "A Self-aligned InGaAs Junction Field-Effect Transistor Grown by Molecular Beam Epitaxy", IEEE EDL-5, 285–287 (1984), incorporated herein by reference). In any case, the surface-wide, p-conductively doped layer (photodiode layer 5) is structured.

In the photodiode-FET combination of the invention, a first contact 9 that is annularly fashioned is applied on that part of the photodiode layer 5 remaining in the region of the photodiode 16, a second contact 12 is applied in the region of the photodiode 16 on the absorption layer 4, a gate contact 8 is applied on the cover layer 7, a drain contact 10 is applied on the channel layer 6, and a source contact 11 is applied on the channel layer 6 in the region of the drain or of the source. An anti-reflection layer 13 applied inside the annular, first contact 9 of the photodiode 16 increases the efficiency of the photodiode by approximately 30%. The photodiode 16 and the FET 15 are separated by a separating trench 14 that extends through all epitaxial layers 2, 3, 4, 5, 6 down into the substrate 1.

Alternatively to the application of the barrier layers 2, 3, a surface-wide p-diffusion or p-implantation into the semi-insulating InP substrate 1 can be realized before the epitaxy in order to improve the insulating property of the substrate 1.

When the semi-insulating property of the substrate 1 suffices or when an adequate improvement of the insulating property of the substrate 1 is achieved with the diffusion or implantation, the barrier layers 2, 3 can be omitted without the basic function of the FET 15 being deteriorated.

By contrast to the prior art (for example, pinFET structures as disclosed in Y. Akahori, S. Hata et al, "Monolithic InP/GaInAs pinFET Receiver using MOMBE-Grown Crystal", Electronics Letters 25, 37–38 (1989), incorporated herein by reference), the structure of the photodiode-FET combination of the invention has the advantage that the FET layers having the structures in the micrometer and sub-micrometer range that are difficult to manufacture lie farthest toward the top in the structure of the invention, and thus allow a contact exposure in the photolithography. By contrast, the photodiode structure that lies only slightly deeper can still be manufactured without problems with considerably greater tolerances. Given the standard doping levels, the step between the field effect transistor and the photodiode given the structure of the invention also amounts to only about 0.5 to 0.6 $\mu$m, whereas semiconductor steps of 2 to 3 $\mu$m are necessary given the structure published in D. A. H. Spear, P. J. G. Dawe, G. R. Antell, W. S. Lee, S. W. Bland, "New Fabrication Technology for Long-Wavelength Receiver OEIC's", Electronics Letters 25, 156–157 (1989), incorporated herein by reference.

Although various minor changes and modifications might be proposed by those skilled in the art, it will be understood that we wish to include within the claims of the patent warranted hereon all such changes and modifications as reasonably come within our contribution to the art.

We claim as our invention:

1. A monolithically integrated photodiode-FET combination, comprising:
    a substrate;
    an absorption layer grown over the substrate;
    a photodiode layer of second conductivity type applied on a top surface of the absorption layer both at the photodiode and at the FET such that the photodiode layer is positioned above the absorption layer;
    a contact on the absorption layer at the photodiode;
    an annular contact applied on the photodiode layer at the photodiode;
    an anti-reflection layer applied on the photodiode layer inside said annular contact;
    a channel layer of first conductivity type applied on the photodiode layer at the FET;
    a cover layer as a gate applied on the channel layer, and a gate contact layer applied on the cover layer;
    a drain contact to one side of the cover layer on the channel layer and a source contact at another side of the cover layer on the channel layer; and
    a separating trench passing through the absorption and photodiode layers between the photodiode and the FET.

2. A photodiode-FET combination according to claim 1 wherein a grown first barrier layer of the second conductivity type is provided between the substrate and the absorption layer, and a grown second barrier layer of the first conductivity type is provided on a side of the first barrier layer that faces away from the substrate.

3. A photodiode-FET combination according to claim 1 wherein the first conductivity type is n-conduction and the second conductivity type is p-conduction.

4. A photodiode-FET combination according to claim 1 wherein the first conductivity type is p-conduction and the second conductivity type is n-conduction.

5. A photodiode-FET combination according to claim 1 wherein said separating trench cuts through the photodiode layer and the absorption layer down into the substrate.

6. A photodiode-FET combination, comprising:
a substrate having adjacent a first surface area thereof a photodiode and adjacent a second surface area thereof an FET with a separating trench between the photodiode and FET which extends into the substrate;
the photodiode comprising an absorption layer with a photodiode layer on a top surface and above the top surface of the absorption layer and flanked by a photodiode contact, and wherein an annular photodiode contact is applied on the photodiode layer;
said FET comprising an absorption layer laterally arranged at a same level as said absorption layer for said photodiode, a layer which is substantially the same as said photodiode layer on a top surface of said absorption layer and entirely above the top surface of said absorption layer and laterally adjacent the photodiode layer of the photodiode, a channel layer on and above the laterally adjacent layer, a source and a drain contact on the channel layer, a gate cover layer between the source and drain contact on and above the channel layer, and a gate contact layer lying on and above the gate cover layer.

7. A photodiode-FET combination according to claim 6 wherein first and second barrier layers are provided between each of the absorption layers of the photodiode and FET and the substrate, and wherein said separating trench separates said absorption layers and portions of the first and second barrier layers of the respective photodiode and FET.

8. A monolithically integrated photodiode-FET combination, comprising:
a substrate;
an absorption layer over the substrate;
a substantially same photodiode layer applied on the absorption layer at the photodiode and at the FED and lying above the absorption layer;
a contact on the absorption layer at the photodiode, and another contact applied on the photodiode layer at the photodiode;
a channel layer applied on the photodiode layer at the FET and lying above the photodiode layer;
a cover layer as a gate applied on the channel layer, and a gate contact layer applied on the cover layer;
a drain contact to one side of the cover layer on the channel layer and a source contact at another side of the cover layer on the channel layer; and
a separating trench extending through the photodiode and absorption layers between the photodiode and the FET.

* * * * *